United States Patent
White et al.

(10) Patent No.: US 6,421,252 B1
(45) Date of Patent: Jul. 16, 2002

(54) SYSTEM AND METHOD FOR A SELF ALIGNING MULTIPLE CARD ENCLOSURE WITH HOT PLUG CAPABILITY

(75) Inventors: Wade H. White, Hyde Park; Michael J. Fisher, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/711,059

(22) Filed: Nov. 10, 2000

(51) Int. Cl.$^7$ .............................. H05K 7/14; H05K 9/00
(52) U.S. Cl. ...................... 361/797; 361/727; 361/730; 361/732; 361/759; 361/800; 361/801; 361/816; 174/35 R; 439/74
(58) Field of Search ................................. 361/724, 726, 361/729, 730, 732, 752, 753, 759, 784, 796, 797, 801, 802, 803, 816; 174/35 R; 439/62, 74, 157

(56) References Cited

U.S. PATENT DOCUMENTS 4,821,145 A  * 4/1989 Corfits et al. ................ 361/692
4,840,570 A  * 6/1989 Mann, Jr. et al. ............ 361/787
5,432,682 A  * 7/1995 Giehl et al.
5,467,254 A  * 11/1995 Brusati et al.
5,848,906 A  * 12/1998 Glusker et al. .............. 361/756

FOREIGN PATENT DOCUMENTS

WO       WO 99/55127     * 10/1999

* cited by examiner

Primary Examiner—Jayprakash N. Gandhi
(74) Attorney, Agent, or Firm—Floyd Gonzalez; Cantor Colburn LLP

(57) ABSTRACT

An exemplary embodiment is a method and apparatus for a multiple card enclosure. The multiple card enclosure is arranged for mounting a mother card enclosure and a daughter card enclosure and at least another daughter card enclosure. The mother card enclosure has a first and second daughter card enclosure removably inserted into the mother card enclosure for connecting the first and second daughter card with the mother card. The first daughter card enclosure and the second daughter card enclosure are independently removable to facilitate interchanging the first daughter card and the second daughter card. The daughter card enclosures connected to the mother card enclosure are enclosed in the multiple card enclosure and a mother card connects to a back plane connector of a logic board.

27 Claims, 3 Drawing Sheets

SYSTEM AND METHOD FOR A SELF ALIGNING MULTIPLE CARD ENCLOSURE WITH HOT PLUG CAPABILITY

BACKGROUND OF THE INVENTION

Computers are customarily provided with sheet metal cage structures that contain a mother card connected to a back plane. A back plane is a circuit board or framework that supports other circuit boards, devices, and the interconnections among devices, and provides power and data signals to supported devices. The mother card is the main circuit card in the computer which connects to the back plane of the logic board. The computer cage structure is adapted to receive and removably support at least one and preferably a plurality of options or daughter cards which when operatively installed in their associated cage structure, upgrade the operating capabilities of the computer. A standard containing enclosure protects the individual daughter cards and facilitates the easy insertion and removal of the daughter cards from a mother card (mother board) or back plane slot. These daughter cards may be installed in the computer during the original manufacture of the computer and or subsequently installed by the computer purchaser.

A daughter card is a relatively small rectangular printed circuit having a connecter along one side edge. The mother card or system back plane slot has a socket connector. The daughter card connector plugs into a corresponding socket connector of the mother card to operatively couple the daughter card to the mother card or system back plane slot.

Some manufactures have improved, in limited ways, the serviceability and accessibility of the mother card by implementing a daughter card cage enclosure (chassis). Unfortunately, however, daughter card enclosures limit the card density that is attainable within a particular computer cage structure (housing). In such daughter card enclosures, the daughter card is mounted within a removable card enclosure. This removable card enclosure allows for daughter card installation or removal when the enclosure is installed or removed from the computer cage structure. The enclosure itself inevitably requires space, and the computer cage structure is limited, thus as stated, such enclosures limit the number of daughter cards capable of being installed.

One drawback is the limit of only one daughter card enclosure per mother card enclosure. Having only one daughter card per mother card enclosure limits the technology options available to the system user. Accordingly, there exists a need for a card insertion and removal system of improved construction.

SUMMARY OF THE INVENTION

An exemplary embodiment is a method and apparatus for a multiple card enclosure. The multiple card enclosure is arranged for mounting a mother card enclosure and a daughter card enclosure and at least another daughter card enclosure. The mother card enclosure has a first and second daughter card enclosure removably inserted into the mother card enclosure for connecting the first and second daughter card with the mother card. The first daughter card enclosure and the second daughter card enclosure are independently removable to facilitate interchanging the first daughter card and the second daughter card. The daughter card enclosures connected to the mother card enclosure are enclosed in the multiple card enclosure and the mother card connects to a back plane connector of a logic board.

BRIEF DESCRIPTION OF THE DRAWINGS

Referring now to the exemplary drawings wherein like elements are numbered alike in the several FIGURES.

DETAILED DESCRIPTION OF THE PREFERRED EMBODIMENTS

Figure 1:
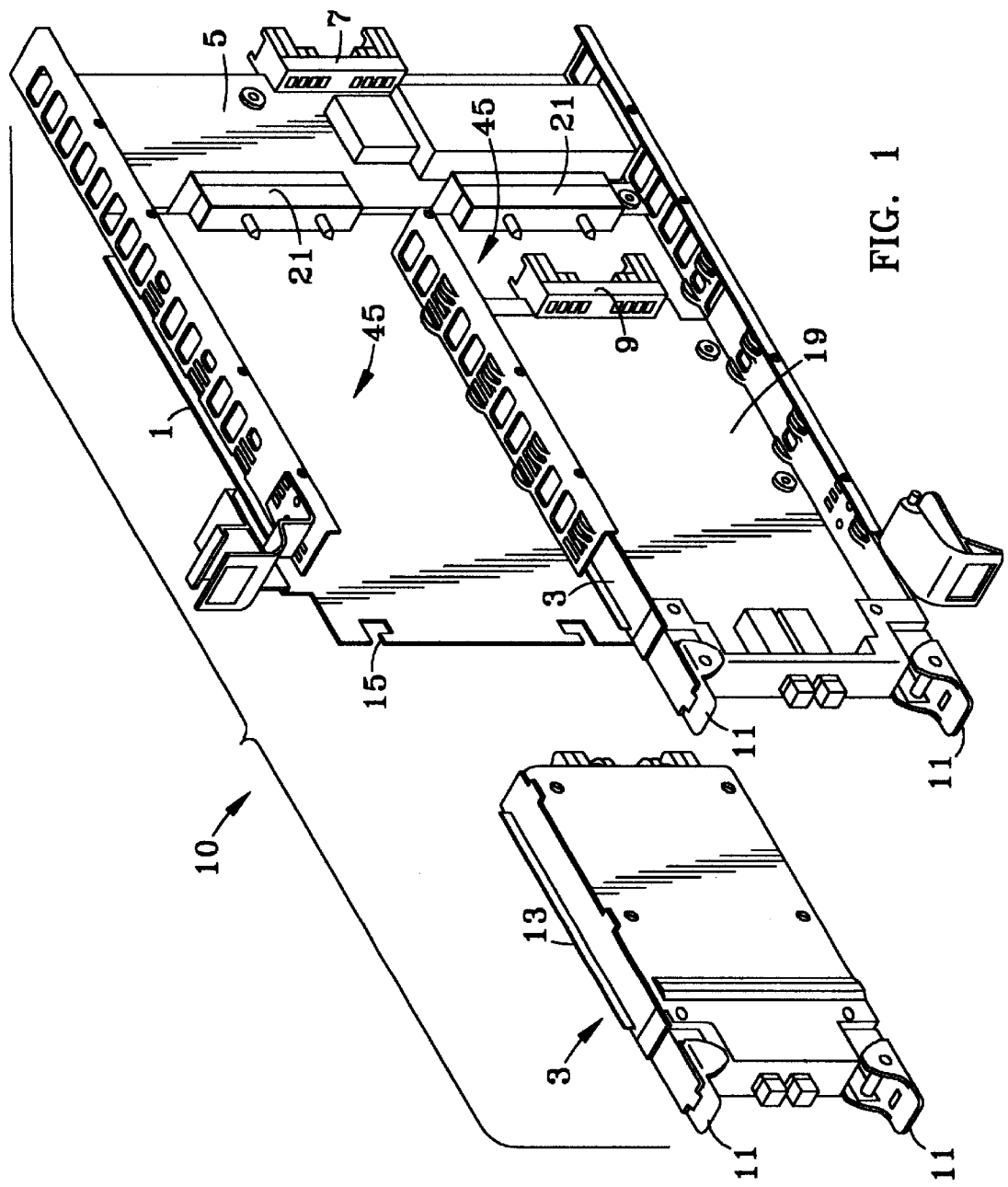
FIG. 1 is a perspective view of an exemplary diagram of the multiple card enclosure illustrating the two daughter card enclosures interfacing with the mother card enclosure.

Referring to the drawings, FIG. 1 shows a perspective view of a multiple card enclosure 10 for mounting a mother card 5 and a daughter card 19 and at least another daughter card (not shown) in combination to connect to a back plane connector of a logic board (not shown). The mother card enclosure 1 encompasses a mother card 5 and at least two daughter card enclosures 3. The daughter card enclosures 3 are independently removable. This independent removability facilitates changing multiple daughter cards 19 into the mother card 5 (mother board) of a logic board. The mother card 5 supported by the mother card enclosure 1 is shown with two mother card connectors 21 and one back plane connector 7. The mother card connectors 21 are mounted to facilitate two daughter card connections 9. The back plane connector 7 is mounted to facilitate a connection to the back plane connector of a logic board (not shown in figure). The mother card enclosure 1 has a pair of mother card enclosure panels 29. FIG. 1 shows the mother card enclosure 1 with a mother card enclosure panel 29 removed. FIG. 1 also shows one daughter card enclosure 3 partially inserted with one of its sides removed to expose the daughter card 19. FIG. 1 also shows another daughter card enclosure 3 removed from the mother card enclosure 1. In the FIG. 1 configuration, two daughter card enclosures 3 can independently and removably be inserted into two separate mother card enclosure spaces 45 to facilitate connection to the mother card connectors 21.

Figure 2:
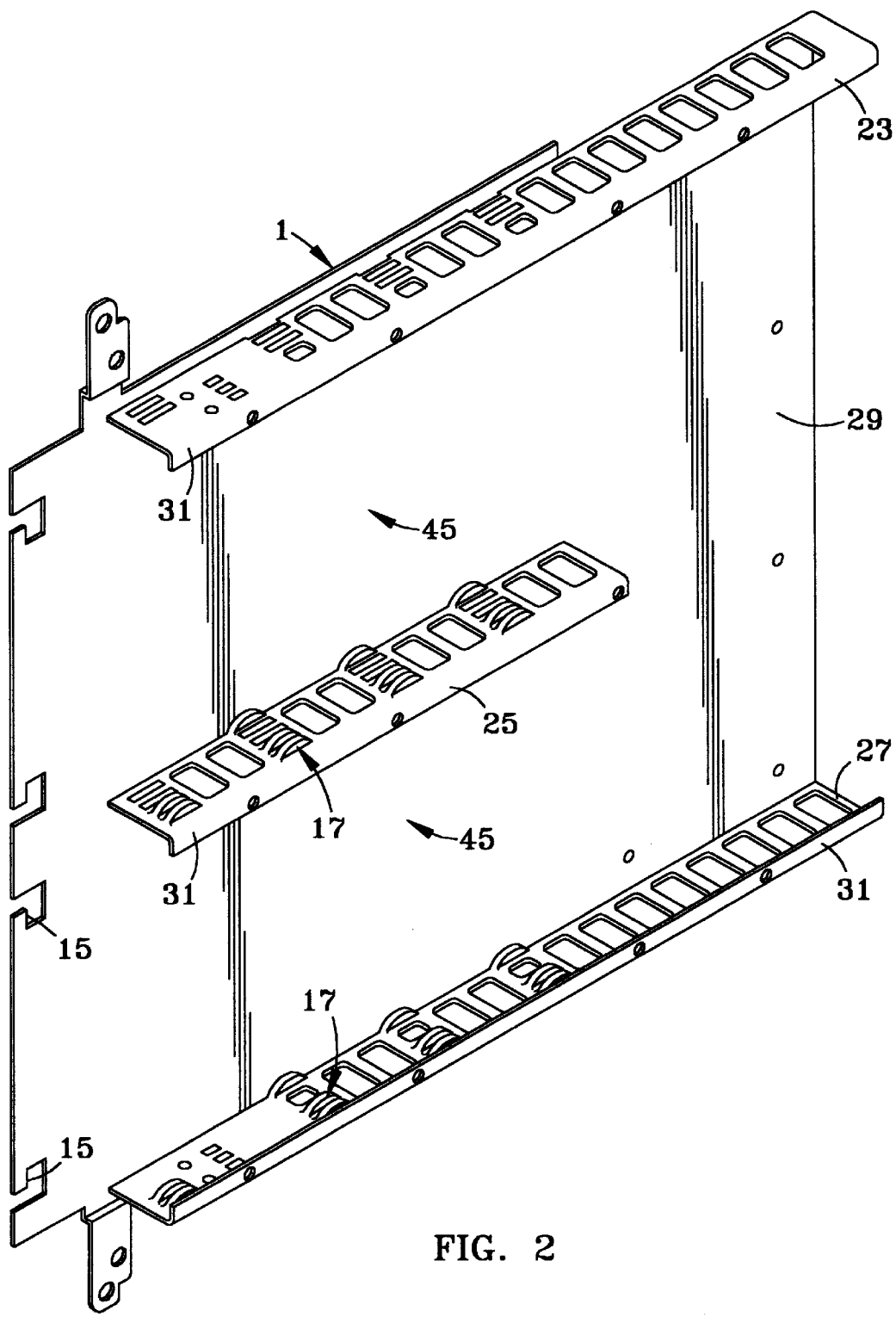
FIG. 2 is a perspective view of an exemplary mother card enclosure with one side not shown.

Turning now to FIG. 2, a perspective view of the mother card enclosure 1 and greater detail of the mother card enclosure 1 features are shown. The figure shows a single mother card enclosure panel 29. In an exemplary embodiment, the mother card enclosure 1 has a pair of mother card enclosure panels 29. However, a single mother card enclosure panel 29 can be used. The pair of mother card enclosure panel 29 are disposed along opposite sides of the mother card 5 supporting and enclosing the mother card 5 and daughter card enclosures 3 (see FIG. 1). The enclosure panel 29 may be formed contiguous, as a webbing or formed with any variety of open regions formed in the panel structure. The mother card enclosure I can have a means of guiding the daughter card enclosure 3, to support and guide or align the daughter card enclosure 3. In an exemplary embodiment, a set of shelves or guide brackets, 23, 25 and 27, are used to support the daughter card enclosures 3. One of the guide brackets, the first alignment guide bracket 23 is disposed between the pair of mother card enclosure panels 29. Opposite the first alignment guide bracket 23, in relation to the mother card enclosure 1, is a third alignment guide bracket 27. The third alignment guide bracket 27 is disposed between a pair of mother card enclosure panels 29. A second alignment guide bracket 25 is disposed between two mother card enclosure panels 29, at a location disposed between the first alignment guide bracket 23 and the third alignment guide bracket 27. The second alignment guide bracket 25 separates the mother card enclosure 1 into two spaces (enclosure spaces). The two enclosure spaces 45 formed within the mother card enclosure 1, are capable of receiving daughter card enclosures 3.

Cam features depicted in FIG. 1 and FIG. 2 are formed along the edges of the mother card enclosure panel 29 opposite the back plane connector 7. The cam features 15 enable the daughter card enclosures 3 to positively seat in the mother card enclosure 1. The cam features 15 enable the daughter card connectors 9 to positively seat both mechanically and electrically with the mother card connectors 21. The mother card enclosure alignment guide brackets 23, 25 and 27, have a plurality of bridge lance features 17 formed in their structure. The bridge lance features may also be attached by various methods to the alignment guide brackets 23, 25 and 27. The bridge lance features 17 allow for proper alignment of the daughter card enclosures 3. The bridge lance features 17 allow for the proper connection between the daughter card connectors 9 and the mother card connectors 21. The alignment guide brackets 23, 25 and 27, also have guide bracket edges 31 formed on the long edges of each of the alignment guide brackets 23, 25 and 27. The alignment guide bracket's guide bracket edges 31 allow for proper joining of the pair of mother card enclosure panels 29 and the alignment guide brackets 23, 25 and 27, of the mother card enclosure 1. The alignment guide brackets 23, 25 and 27, and the pair of mother card enclosure panels 29 may be fastened together by any conventional method. The alignment guide brackets 23, 25 and 27 may also be formed as part of the double daughter card enclosure 10. The alignment guide brackets 23, 25 and 27 may also be formed as part of the mother card enclosure panel 29, to facilitate supporting and aligning the daughter card enclosures inserted in the mother card enclosure.

Figure 3:
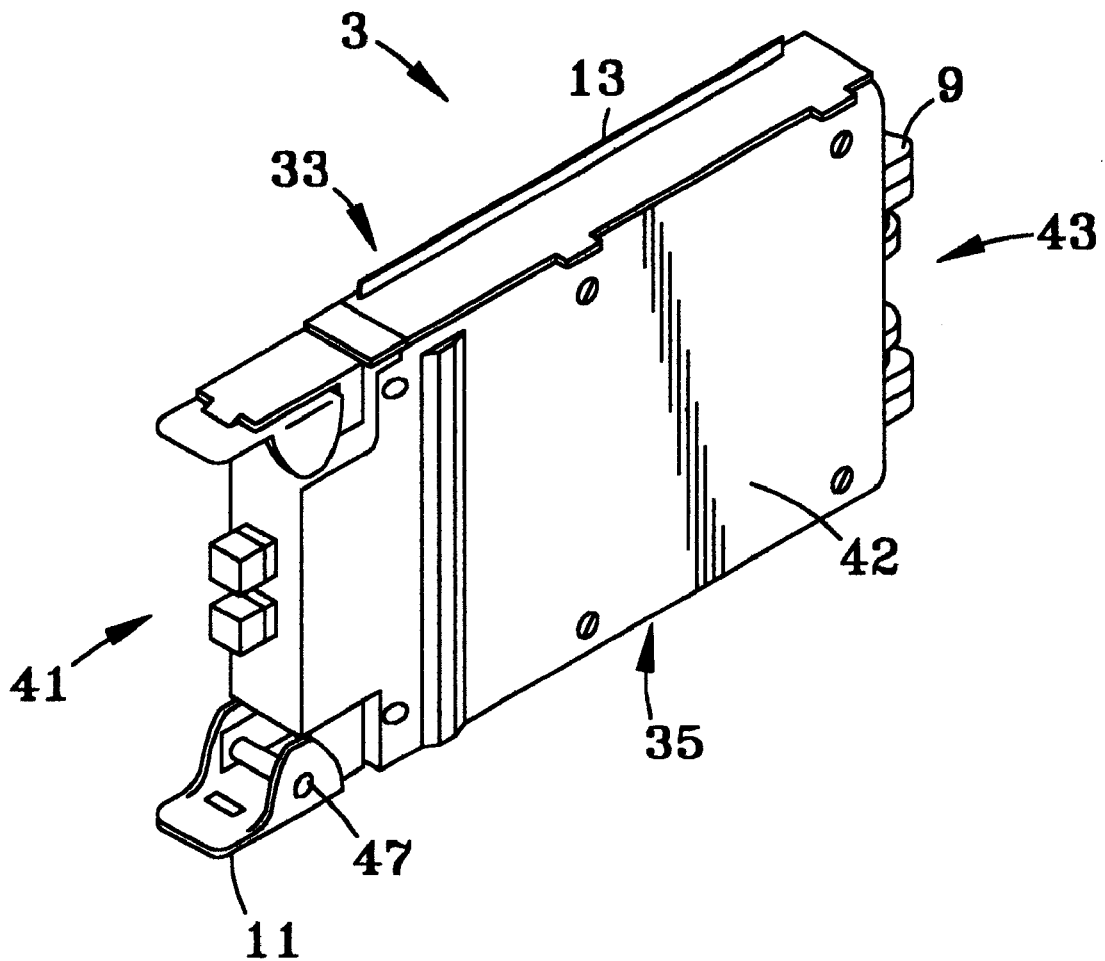
FIG. 3 is a perspective view of an exemplary daughter card enclosure.

Referring to FIG. 3, FIG. 3 shows a perspective view of a daughter card enclosure 3. The daughter card enclosure supports and encloses the daughter card 19 (see FIG. 1) mounted inside the daughter card enclosure 3. A daughter card connector 9 is mounted on the daughter card 3 to facilitate connection to the mother card connector 21. The daughter card enclosure 3 is not limited to being a particular shape. In a preferred embodiment, the daughter card enclosure 3 forms a rectilinear box shape with the daughter card 19 enclosed and supported inside the rectilinear box shape. The daughter card enclosure 3 has a pair of daughter card enclosure panels 42. The daughter card enclosure panels 42 are opposite to each other and enclose the daughter card 19. The daughter card enclosure 3 has a first guide side 33. The first guide side 33 forms the surface that guides the daughter card enclosure 3 along any of the alignment guide brackets 23, 25 and 27 depending on the orientation of the daughter card enclosure 3.

The daughter card enclosure 3 has a second guide side 35. In the preferred embodiment the second guide side 35 is in a separate but substantially parallel plane opposite the first guide side 33 and both of the guide sides 33 and 35 are substantially perpendicular to the daughter card enclosure panels 42. In the preferred embodiment, the daughter card enclosure panels form the longest substantially parallel sides of the rectilinear box and the first guide side 33 and the second guide side 35 form two more sides substantially parallel and opposite thereof and attached to the daughter card enclosure panels 29. A cross section of the preferred embodiment of the daughter card enclosure 3 is a rectangle. The second guide side 35 forms a surface that guides the daughter card enclosure 3 along the any of the alignment guide brackets 23, 25 and 27 depending on the orientation of the daughter card enclosure 3. The daughter card enclosure 3 also has an access end 41 and a connector end 43 opposite each other. In the preferred embodiment, the access end 41 and the connector end are in planes substantially parallel and are located opposite each other to close the ends of the rectilinear box shape formed by the daughter card enclosure panels 29 and the first guide side 33 and second guide side 35. In the preferred embodiment, one of the plurality of daughter card enclosures 3 inserts into the mother card enclosure oriented such that the connector end 43 is positioned to seat with the mother card connector 21. Additionally, in the preferred embodiment, the first guide side 33 is guided by the first alignment guide bracket 23 and the second guide side 35 is guided by the second alignment guide bracket 25 such that the connector end 43 is guided to the mother card connector 21 and the access end 41 is oriented opposite the connector end 43 and away from the mother card connector 21. Still further, in the same preferred embodiment, a second daughter card enclosure 3 is oriented to be inserted into the mother card enclosure 1 into one of the unoccupied mother card enclosure spaces 45, in order that the daughter card connector 9 on the connector end 43 is positioned to connect with the mother card connector 21 associated with the unoccupied mother card enclosure space 45. Further, in the preferred embodiment, the first guide side 33 of the second daughter card enclosure 3 is guided by the second alignment guide bracket 25 and the second guide side 35 is guided by the third alignment guide bracket such that the daughter card connector 9 located on the connector end 43 of the second daughter card enclosure is guided to seat with the mother card connector 21 and the access end 41 of the second daughter card connector 3 is opposite the connector end 43 and distant from the mother card connector 21.

The daughter card enclosure 3 has a means for guiding the daughter card enclosure 3 into the mother card enclosure 1. In a preferred embodiment, the daughter card enclosure 3 has guide rails 13. The guide rails 13 are disposed on the first guide side 33 of the daughter card enclosure 3. Guide rails 13 are also disposed on the second guide side 35 of the daughter card enclosure 3. The guide rails 13 work with the bridge lance features 17 of the first alignment guide bracket 23, second alignment guide bracket 25, and the third alignment guide bracket 27 of the mother card enclosure 3 to facilitate proper alignment of the daughter card connector 9 and the mother card connector 21, respectively. The bridge lance features 17 and the guide rails 13 are capable of aligning the daughter card enclosure 3 into place within the mother card enclosure 1, with a tolerance of plus or minus 0.5 mm from side to side. In other words, the daughter card enclosure 3 is aligned with a variation of side to side tolerance of 0.5 mm between the mother card enclosure panel 29 and the adjacent daughter card enclosure panel 42.

FIG. 3 and FIG. 1 demonstrate the daughter card enclosure equipped with daughter card enclosure latches 11. The daughter card enclosure latches 11, coupled to the daughter card enclosure 3, operate along with the cam features 15 of the mother card enclosure 1 to positively secure and seat the daughter card enclosure 3 with the mother card enclosure 1. The daughter card enclosure latches 11 are shown mounted to the access end 41 on the first guide side 33, as well as the second guide side 35 of the daughter card enclosure 3. The daughter card enclosure latches 11 rotate about pivot pins 47 mounted on the daughter card enclosure 3. The daughter card enclosure latches 11 rotate in combination with the mother card enclosure cam features 15 to push the daughter card enclosure 3 forward towards the mother card connector 21. The daughter card enclosure latches 11 and the mother card enclosure cam features 15 positively seat the daughter card connector 9 and the mother card connector 21. The daughter card enclosure 3 may also have a seating means to function to seat the daughter card connector 9 with a mother card connector 21 mechanically and electrically.

The current embodiment shown in the figures demonstrates one mother card enclosure 1 with two daughter card enclosures 3. However, in other embodiments, more than two daughter card enclosures 3 may be facilitated. The figures show a configuration that allows the daughter card enclosures 3 to be mounted inside the mother card enclosure 1, one stacked on top of the other. The daughter card enclosures 3 are co-planar with the mother card enclosure 5. The daughter card 19 is parallel with the mother card 5. The multiple card enclosure 10 allows for the independent removal/insertion of the daughter card enclosures 3 without effecting any other daughter card enclosure 3 mounted in the mother card enclosure. Multiple technologies associated with the multiple daughter cards 3 can be interchanged with a single mother card 5 in a logic board. The multiple card enclosure 10 provides for serviceability and adaptability of the system.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A multiple card enclosure comprising:
   a mother card enclosure having a mother card enclosed therein;
   a first daughter card enclosure removably inserted into the mother card enclosure for connecting a first daughter card with the mother card, said first daughter card enclosure having said first daughter card enclosed therein;
   a second daughter card enclosure removably inserted into the mother card enclosure for connecting a second daughter card with the mother card, said second daughter card enclosure having said second daughter card enclosed therein;
   wherein, the first daughter card enclosure and the second daughter card enclosure are independently removable to facilitate interchanging the first daughter card and the second daughter card;
   wherein, the mother card enclosure, with the first daughter card enclosure and the second daughter card enclosure removably inserted therein, is connectable to a back plane of a logic board;
   further comprising a plurality of bridge lance features for aligning said first daughter card enclosure and said second daughter card enclosure with said mother card enclosure.

2. The multiple card enclosure of claim 1, wherein the mother card having two mother card connectors mounted thereon to facilitate connections to the first daughter card and the second daughter card, respectively; and a backplane connector mounted to the mother card to facilitate connection to the back plane.

3. The multiple card enclosure of claim 2, further comprising:
   said first daughter card enclosure supports and encloses said first daughter card mounted therein;
   the first daughter card having a daughter card connector mounted thereon to facilitate connection to the mother card connector;
   said second daughter card enclosure supports and encloses said second daughter card mounted therein; and
   the second daughter card having a daughter card connector mounted thereon to facilitate connection to the mother card connector.

4. The multiple card enclosure of claim 3, wherein, the mother card enclosure independently and removably receives the first daughter card enclosure and independently and removably receives the second daughter card enclosure in separate mother card enclosure spaces such that the first daughter card enclosure connector is aligned in connection with a first mother card enclosure connector and the second daughter card enclosure connector is aligned in connection with a second mother card enclosure connector, ensuring that the insertion and removal of said first daughter card enclosure will not effect said second daughter card enclosure within the mother card enclosure and ensuring that the insertion and removal of said second daughter card enclosure will not effect said first daughter card enclosure within the mother card enclosure.

5. The multiple card enclosure of claim 4, wherein, the mother card enclosure receives the first daughter card enclosure and the second daughter card enclosure in the separate mother card enclosure spaces, oriented vertically stacked, such that the first daughter card enclosure and the second daughter card enclosure are aligned along the same plane with the mother card enclosure.

6. The multiple card enclosure of claim 1, further comprising:
   a mother card enclosure panel disposed along the mother card for supporting and enclosing the mother card;
   an alignment guide bracket disposed on said mother card enclosure panel forming mother card enclosure spaces for receiving in alignment a daughter card enclosure.

7. The multiple card enclosure of claim 1, further comprising:
   a pair of mother card enclosure panels disposed along opposite sides of the mother card for supporting and enclosing the mother card;
   a first alignment guide bracket disposed between said pair of mother card enclosure panels of said mother card enclosure;
   a third alignment guide bracket disposed between said pair of mother card enclosure panels opposite said first alignment guide bracket of said mother card enclosure; and
   a second alignment guide bracket disposed between said pair of mother card enclosure panels and disposed between said first alignment guide bracket and said third alignment guide bracket separating the mother card enclosure into two mother card enclosure spaces for receiving the first daughter card enclosure and the second daughter card enclosure.

8. The multiple card enclosure of claim 7, further comprising:
   at least one cam feature formed in said mother card enclosure panel for securing said first daughter card enclosure and said second daughter card enclosure inside said mother card enclosure.

9. The multiple card enclosure of claim 7, wherein:
   said plurality of bridge lance features are integral to said first alignment guide bracket, said second alignment guide bracket and said third alignment guide bracket; and further comprising,
   at least one guide bracket edge formed on a long edge of the first alignment guide bracket, the second alignment guide bracket and the third alignment guide bracket that adjoins said pair of mother card enclosure panels of the mother card enclosure, wherein the at least one guide bracket edge facilitates coupling said first alignment guide bracket, said second alignment guide bracket and said third alignment guide bracket to said pair of mother card enclosure panels.

10. The multiple card enclosure of claim 8, further comprising:
a first daughter card enclosure panel enclosing and supporting said first daughter card,
a first guide side disposed on said first daughter card enclosure panel, and a second guide side disposed on said first daughter card enclosure panel opposite the first guide side, to receivably guide said first daughter card enclosure into said mother card enclosure, and an access end and a connector end opposite thereof, substantially adjacently coupled to both said first daughter card enclosure panel and said first guide side and said second guide side, to facilitate connecting said first daughter card enclosure to said mother card enclosure space, wherein said first daughter card is connected to said mother card therein; and
a second daughter card enclosure panel enclosing and supporting said second daughter card
a first guide side disposed on said second daughter card enclosure panel, and a second guide side disposed on said second daughter card enclosure panel opposite the first guide side, to receivably guide said second daughter card enclosure into said mother card enclosure, and an access end and a connector end opposite thereof, substantially adjacently coupled to both said second daughter card enclosure panel and said first guide side and said second guide side, to facilitate connecting said second daughter card enclosure to said mother card enclosure space, wherein said second daughter card is connected to said mother card therein.

11. The multiple card enclosure of claim 10, further comprising:
a guide rail disposed on said first guide side of said first daughter card enclosure and a guide rail disposed on said second guide side of said first daughter card enclosure for aligning said first daughter card enclosure within said mother card enclosure; and
a guide rail disposed on said first guide side of said second daughter card enclosure and a guide rail disposed on said second guide side of said second daughter card enclosure for aligning said second daughter card enclosure within said mother card enclosure.

12. The multiple card enclosure of claim 11, wherein, the guide rails disposed on said first daughter card enclosure are guided by bridge lance features of the first alignment guide bracket, and the second alignment guide bracket and guide rails of the second daughter card enclosure are guided by the bridge lance features of the second alignment guide bracket and the third alignment guide bracket of the mother card enclosure.

13. The multiple card enclosure of claim 12, wherein, the guide rail disposed on said first guide side of said first daughter card enclosure and the guide rail disposed on said second guide side of said first daughter card enclosure for aligning said first daughter card enclosure within said mother card enclosure are guided by the bridge lance features holding the associated first daughter card enclosure into place with about 0.5 mm of said mother card enclosure panel; and the guide rail disposed on said first guide side of said second daughter card enclosure and the guide rail disposed on said second guide side of said second daughter card enclosure for aligning said second daughter card enclosure within said mother card enclosure are guided by the bridge lance features holding the associated second daughter card enclosure into place with about 0.5 mm of said mother card enclosure panel.

14. The multiple card enclosure of claim 13, further comprising:
at least one daughter card enclosure latch coupled to said first daughter card enclosure and at least one daughter card enclosure latch coupled to said second daughter card enclosure for securing said first daughter card enclosure and said second daughter card enclosure to said cam feature of said mother card enclosure.

15. The multiple card enclosure of claim 14, wherein said at least one daughter card enclosure latch is mounted to said first daughter card enclosure at the access end of said first daughter card enclosure.

16. The multiple card enclosure of claim 14, wherein said at least one daughter card enclosure latch is mounted to said second daughter card enclosure at the access end of said second daughter card enclosure.

17. The multiple card enclosure of claim 10, wherein a daughter card connector is at the connector end of said first daughter card enclosure.

18. The multiple card enclosure of claim 10, wherein a daughter card connector is at the connector end of said second daughter card enclosure.

19. The multiple card enclosure of claim 1, wherein the first daughter card enclosure has a daughter card enclosure panel enclosing and supporting said first daughter card disposed therein; and
the second daughter card enclosure has a daughter card enclosure panel enclosing and supporting said second daughter card is disposed therein.

20. The multiple card enclosure of claim 19, wherein the daughter card enclosure panel has a guide means for guiding said first daughter card enclosure into said mother card enclosure; and a guide means for guiding said second daughter card enclosure into said mother card enclosure.

21. In a system having a multiple card enclosure, a method of using the system comprising:
receiving, within a mother card enclosure having a mother card mounted therein, and said mother card enclosure being equipped with at least two mother card connectors and a back plane connector and said enclosure adapted to receive at least two daughter card enclosures, a first daughter card enclosure and a second daughter card enclosure wherein, said first daughter card enclosure has a first daughter card mounted therein and said second daughter card enclosure has a second daughter card mounted therein;
inserting independently removably said first daughter card enclosure and said second daughter card enclosure into said mother card enclosure;
aligning said first daughter card enclosure and said second daughter card enclosure by use of guide rails and a plurality of bridge lance features; and
connecting daughter card connectors with said mother card connectors wherein, said daughter card connectors are mounted on each of said first daughter card enclosure and said second daughter card enclosure, and connecting said mother card back plane connector with a back plane of a logic board.

22. The method of claim 21 further comprising:

interchanging said first daughter card enclosure and said second daughter card enclosure independently with a plurality of daughter card enclosures without effecting said first daughter card and said second daughter card to facilitate a variety of technologies within said logic board.

23. The method of claim 21 further comprising:

aligning said first daughter card enclosure and said second daughter card enclosure by use of said guide rails and said bridge lance features, wherein said guide rails are disposed in a first guide side and a second guide side of said first daughter card enclosure and said second daughter card enclosure, and said plurality of bridge lance features are integral with a first alignment guide bracket, a second alignment guide bracket and a third alignment guide bracket of said mother card enclosure.

24. The method of claim 21, further comprising:

seating said daughter card enclosure to said mother card enclosure using daughter card enclosure latches mounted on said first daughter card enclosure and said second daughter card enclosure in combination with cam features formed in said mother card enclosure.

25. The method of claim 24, further comprising:

rotating said daughter card latches about pivot pins mounted on said first daughter card enclosure and said second daughter card enclosure in combination with said mother card enclosure cam features to cam said first daughter card enclosure and said second daughter card enclosure forward to seat said first daughter card connector with a first mother card connector and said second daughter card connector with a second mother card connector.

26. The method of claim 21, wherein, said aligning of said first daughter card enclosure and said second daughter card enclosure with said mother card enclosure is aligned into place with a variation of side to side tolerance of about 0.5 mm to ensure alignment of said connectors.

27. The multiple card enclosure of claim 1, further comprising guide rails cooperating with said plurality of bridge lance features for aligning said first daughter card enclosure and said second daughter card enclosure with said mother card enclosure.

* * * * *